United States Patent [19]

Voorman

[11] Patent Number: 4,485,357
[45] Date of Patent: Nov. 27, 1984

[54] CIRCUIT FOR AMPLITUDE AND PHASE MODULATION OF CARRIER SIGNAL BY TWO RESPECTIVE INPUT SIGNALS

[75] Inventor: Johannes O. Voorman, Eindhoven, Netherlands

[73] Assignee: U.S. Philips Corporation, New York, N.Y.

[21] Appl. No.: 346,703

[22] Filed: Feb. 8, 1982

[30] Foreign Application Priority Data

Mar. 9, 1981 [NL] Netherlands ..................... 8101109

[51] Int. Cl.³ ............................................. H03C 5/00
[52] U.S. Cl. ...................................... 332/17; 332/21; 332/22; 332/41; 455/102
[58] Field of Search ................... 332/17, 21, 22, 23 R, 332/9 R, 40, 41, 48; 455/102

[56] References Cited

U.S. PATENT DOCUMENTS 3,778,718 12/1973 Bass et al. ........................ 455/102
4,079,204 3/1978 Takahashi et al. ............ 455/102 X Primary Examiner—Siegfried H. Grimm
Assistant Examiner—David C. Mis
Attorney, Agent, or Firm—Thomas A. Briody; William J. Streeter

[57] ABSTRACT

An electronic arrangement for generating an amplitude and phase-modulated carrier signal having a phase modulation stage with two inputs for receiving two modulation signals, which modulation stage generates two different phase-modulated signals having the same carrier frequency and substantially the same amplitude, and an output stage to which the phase-modulated signals are applied for assembling by means of summation of the phase-modulated signals to produce the amplitude and phase-modulated carrier, the amplitude of which is modulated in dependence on the phase difference of the phase-modulated signals and the phase of which is modulated in dependence on the sum of the phases of the phase-modulated signals.

15 Claims, 14 Drawing Figures

CIRCUIT FOR AMPLITUDE AND PHASE MODULATION OF CARRIER SIGNAL BY TWO RESPECTIVE INPUT SIGNALS

BACKGROUND OF THE INVENTION

1. Field of the Invention

The invention relates to an electronic arrangement for generating an amplitude and phase-modulated carrier signal.

In radio transmission a great diversity of amplitude and phase-modulated carrier signals are employed, such as single-sideband signals, so-called "Offset Quadrature Phase Shift Keying" signals, abbreviated to OQPSK-signals, and so on.

The most important advantage of signals modulated in this manner, compared to signals of which only the amplitude, the phase or the frequency have been modulated resides in the fact that the bandwidth required for the transmission of the same quantity of information in amplitude and phase-modulated signals is less than for signals of which only the amplitude, the phase or the frequency is modulated. So, a carrier signal whose amplitude and phase are modulated by an information signal, for example a single-sideband signal and a 4-phase modulated signal with limited bandwidth respectively, or a OQPSK-modulated signal requires half the bandwidth of a carrier signal whose amplitude is modulated by the same information signal, such as a double-sideband signal and a narrower bandwidth, respectively than a carrier signal without band limitation which is 4-phase modulated by the same information signal, such as what are commonly referred to as a "Fast Frequency Shift Keying"-signal (FFSK) or a "Minimum Shift Keying"-signal (MSK).

2. Description of the Prior Art

Existing systems often employ only phase or frequency modulation, as the case may be, as the distortion of non-linear, efficient power amplifiers is then only located around multiples of the carrier frequencies. This distortion can be eliminated in a simple manner subsequently by means of filtering. If, however, amplitude modulation is also present then distortion is produced in the information band itself. A low distortion level is then realized by means of extremely linear amplifiers. These amplifiers are expensive and have a low efficiency.

It is an object of the invention to provide an electronic circuit arrangement for an amplitude and phase-modulated signal which obviates the drawbacks mentioned in the foregoing to a very high extent while maintaining the narrow-band character and which in addition makes it possible to realize the modulation at a low-signal level by means of integrated circuits and to form therefrom a high-power output signal in a very simple and efficient manner.

SUMMARY OF THE INVENTION

According to the invention there is provided an electronic arrangement for generating an amplitude and phase-modulated carrier signal, the arrangement comprising a phase modulation stage having two inputs for receiving two modulation signals, which modulation stage under the control of the modulation signals generates in use two different phase-modulated signals having the same carrier frequency and substantially the same amplitude, and an output stage to which the phase-modulated signals are applied for assembling by means of summation of the phase-modulated signals to produce the amplitude and phase-modulated carrier signal the amplitude of which is modulated in dependence on the phase difference of the phase-modulated signals and the phase of which is modulated in dependence on the sum of the phases of the phase-modulated signals.

The use of two auxiliary signals in the form of exclusively phase-modulated signals has the advantage that it is possible to employ non-linear amplification for each of the phase-modulated signals because of the fact that the information is located in the zero-crossings of the signal, the location of which is not adversely affected by non-linear amplification, so that a very high efficiency can be obtained on amplification. In addition, it has the advantage that the suppression of the higher order signals generated during the amplification requires only a simple low-pass filter. Furthermore, auxiliary signals having discrete values can be used, so that the electronic circuit can predominantly be realized in integrated form.

The use of substantially equal amplitudes for the phase-modulated signals has the advantage that not only the phase-modulated signals themselves but also the equipment for generating these signals and the assembly of said signals to form the amplitude and phase-modulated signal can be greatly simplified.

Owing to the fact that the amplitude and phase-modulated signal is obtained by adding or subtracting these auxiliary signals having discrete values, but for a low-pass filtering operation, it is furthermore possible, in combination with the use of non-linear amplification to implement a very simple power output stage.

If desired, the phase modulation stage may convert a first modulation signal $x_1(t)$ and a second modulation signal $x_2(t)$ into two phase-modulated signals $Z_1(t) = a \cos(w_o t + \psi(t))$ and $Z_2(t) = a \cos(w_o t + \chi(t))$ the phase $\psi(t)$ of the first phase-modulated signal $Z_1(t)$ being equal to $\phi(t) + \theta \arccos(r(t)/2a) + m 2\pi$ and wherein the phase $\chi(t)$ of the second phase-modulated signal $Z_2(t)$ is equal to $$\phi(t) - \arccos(r(t)/2a) + n 2\pi + \frac{1-\eta}{2} \pi$$

and for which it holds that $\eta = +1$ when adding $Z_1(t)$ and $Z_2(t)$ together to form $S(t)$ and $\eta = -1$ when subtracting $Z_2(t)$ from $Z_1(t)$ to form $S'(t)$ and the modulation signals $x_1(t)$ and $x_2(t)$ represent the coordinates of a vector in a system of coordinates, which vector, transformed in a system of polar coodinates by the quantities $r(t)$ and $\phi(t)$, wherein $\theta = \pm 1$, m and n being integers and the amplitude and phase-modulated signal $S(t)$ and $S'(t)$, respectively being represented by $r(t) \cos(w_o t + \phi(t))$.

The present invention will now be described, by way of example, with reference to the accompanying drawings in which corresponding elements have been given the same reference numerals.

DETAILED DESCRIPTION OF THE PREFERRED EMBODIMENTS

Figure 1:
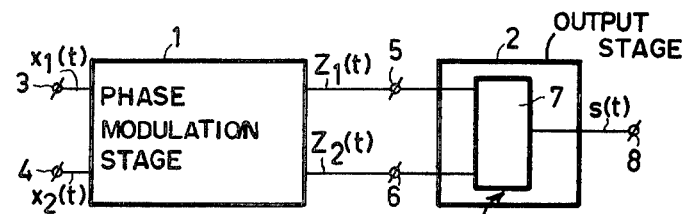
FIG. 1 is a block schematic circuit diagram of the electronic arrangement in accordance with the invention.

The block schematic circuit diagram of an electronic arrangement in accordance with the invention, shown in FIG. 1, comprises a phase-modulation stage 1 and an output stage 2 connected thereto for generating an amplitude and phase-modulated output signal.

For that purpose a first modulation signal $x_1(t)$ is applied to a first input 3 of the phase modulation stage and a second modulation signal $x_2(t)$ to a second input 4 of the modulation stage 1. In the modulation stage 1 two phase-modulated signals $$Z_1(t) = a \cos(w_0 t + \psi(t)) \tag{1}$$

and $$Z_2(t) = b \cos(w_0 t + \chi(t)) \tag{2}$$

having the same carrier frequencies are generated by means of the modulation signals in a manner to be described hereafter. The amplitudes of these phase-modulated signals have here been chosen differently to explain one of the advantages of the arrangement in accordance with the invention. Said phase-modulated signals are applied to the output stage 2 via the outputs 5 and 6 of the modulation stage 1. This output stage comprises a first summing arrangement 7 which assembles the phase-modulated signals $Z_1(t)$ and $Z_2(t)$ by addition or subtraction. The sum signal $S(t) = Z_1(t) + \eta Z_2(t)$, wherein $\eta = \pm 1$ thus obtained is applied to an output terminal 8. This sum signal $S(t)$ is an amplitude and phase-modulated signal having the same carrier frequency as the phase-modulated signals and is represented by $$S(t) = r(t) \cos(\omega_0 t + \phi(t)) \tag{3}$$

From the signal $S^{(')}(t) = Z_1(t) \pm Z_2(t)$ obtained by addition or subtraction, as the case may be, it follows that:

$$\phi(t) = \phi(t) + \theta \arctan \sqrt{\frac{(a+b)^2 - r^2(t)}{r^2(t) - (a-b)^2}} - \tag{4}$$

$$\theta \arctan \frac{a-b}{a+b} \sqrt{\frac{(a+b)^2 - r^2(t)}{r^2(t) - (a-b)^2}} + (k-1)\pi$$

and $$\kappa(t) = \phi(t) - \theta \arctan \sqrt{\frac{(a+b)^2 - r^2(t)}{r^2(t) - (a-b)^2}} - \tag{5}$$

$$\theta \arctan \frac{a-b}{a+b} \sqrt{\frac{(a+b)^2 - r^2(t)}{r^2(t) - (a-b)^2}} + (k+1)\pi + \frac{\eta-1}{2}\pi$$

wherein $\eta = +1$ for $S(t) = Z_1(t) + Z_2(t)$ and $\eta = -1$ for $S'(t) = Z_1(t) - Z_2(t)$ and wherein $\theta = \pm 1$ is a degree of freedom and may consequently be chosen at option $(-1)^{k+1}$ = sign r(t) and k and l are integers. The expressions (4) and (5) are very complex. By choosing in accordance with one of the measures of the invention the amplitudes of the phase-modulated signals $Z_1(t)$ and $Z_2(t)$ to be equal to each other, for example equal to $\frac{1}{2}$, $\eta = +1$ and $r(t) \geq 0$, the expressions (4) and (5) can be simplified to $$\psi(t) = \phi(t) + \theta \arccos(r(t)/2a) + m2\pi \tag{6}$$

and $$\chi(t) = \phi(t) - \theta \arccos(r(t)/2a) + n2\pi \tag{7}$$

wherein m an n are integers.

Similar expressions can likewise be derived for $\eta = -1$. In the following description this possibility is not worked out in detail, but can be effected in a simple manner in an identical way as for $\eta = +1$ by a person skilled in the art.

From the foregoing it follows than an amplitude and phase modulated carrier signal with a predetermined carrier frequency in a very simple electronic arrangement may be obtained by summing two phase-modulated carrier signals having the same amplitude and the same carrier frequencies. Subtracting the expression (7) from expression (6) shows that the amplitude modulation of the amplitude and phase-modulated carrier signal is a function of the relative phase difference $(\psi(t) - \chi(t))$ of the phase-modulated signals and adding the expression (7) to expression (6) shows that the phase modulation of the amplitude and phase-modulated carrier signal is a function of the sum of the phases ($\psi(t)+\chi(t)$) of the phase-modulated signals.

Figure 2:
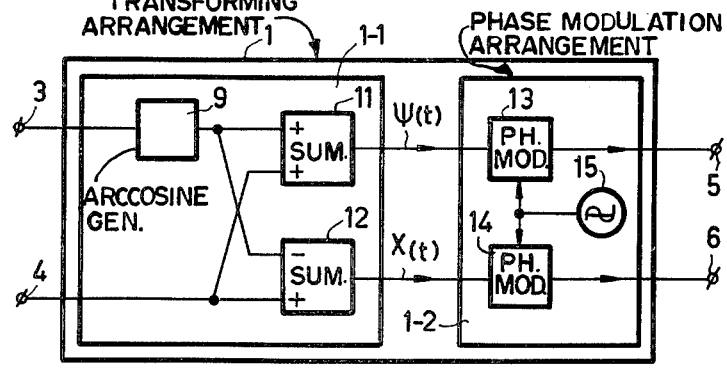
FIG. 2 shows an embodiment of the phase-modulation stage of the block diagram shown in FIG. 1.

FIG. 2 shows an embodiment with reference to which the generation of the phase-modulated signals $Z_1(t)$ and $Z_2(t)$ by means of the modulation signals $x_1(t)$ and $x_2(t)$ will be explained in greater detail.

As modulation signals a signal $r(t)$ is chosen for the signal $x_1(t)$ and a signal $\phi(t)$ for the signal $x_2(t)$, wherein $r(t)$ and $\phi(t)$ represent the coordinates of a vector in a system of polar coordinates. The phase modulation stage 1 comprises a signal transforming arrangement 1-1 and a phase modulation arrangement 1-2. Via input terminal 3 the modulation signal $r(t)$ is applied to an arccosine generator 9 of the signal transforming arrangement 1-1 to form an output signal $\pi/2+\theta$ arccos $r(t)$. Such a generator for generating arcsine $r(t)$ is known from, for example, the book "Electronic Analog and Hybrid Computers" by G. A. Korn and T. M. Korn, more specifically from FIGS. 8–29(b), arccos $r(t)$ is derived therefrom by adding $\pi/2$ to it. The output signal of generator 9 and the signal $\phi(t)$ are both applied to a second summing arrangement 11 and a third summing arrangement 12 for the determination in the second summing arrangement 11 of the sum signal:

$$\psi(t)=\phi(t)+\theta \text{ arccos }(r(t))$$

and for the determination in the third summing arrangement 12 of the difference signal:

$$\chi(t)=\phi(t)-\theta \text{ arccos }(r(t))$$

The output signals of the signal transforming arrangement 1-1 are applied to the phase modulation arrangement 1-2. More particularly, the output signal of the summing arrrangement 11 and 12, respectively, is applied to a phase modulator 13 and 14, respectively, to which phase-modulators a carrier generator 15 is connected for forming the phase-modulated signals $Z_1(t)$ and $Z_2(t)$. The phase modulators 13 and 14 together may form, for example, a quadrature modulator which delivers its output signals from the output terminals 5 and 6.

So far the description has been based on a modulation signal which forms the vector components of a vector in a system of polar coordinates. Let it be assumed that the modulation signals $x_1(t)$ and $x_2(t)$ are expressed as the signal components of a signal vector in a cartesian coordinate system, then there is required between the input terminals 3 and 4 and the inputs of the generator 9 and the arrangement 12 a coordinate transforming arrangement, not shown, which in known manner determines on the one hand the modulation envelope $r(t)=\sqrt{x^2_1(t)+x^2_2(t)}$ of the modulation signals and applies said envelope to the arccosine generator 9, and on the other hand determines the argument $\phi(t)=\arctan(x_2(t)/x_1(t))$ and applies said argument to the arrangement 12.

An example of an amplitude and phase-modulated carrier signal to be generated by the electronic circuit is a single-sideband signal.

Such a signal may be represented by:

$$Re(a(t)+j\hat{a}(t))e^{j\omega_0 t} \qquad (8)$$

wherein $e^{j\omega_0 t}$ represents the carrier signal and $a(t)$ is the baseband signal, and $\hat{a}(t)$ the Hilbert transform of the baseband signal $a(t)$. Between a signal $a(t)$ and a Hilbert transformed $\hat{a}(t)$ there is the following relationship:

$$\hat{a}(t) = \frac{S}{r} \int_{-\infty}^{+\infty} \frac{a(\tau)}{t-\tau} d\tau \qquad (9)$$

wherein $S=+1$ for the upper sideband signal and $S=-1$ for the lower sideband signal, wherein $\omega_o$ represents the angular frequency of the carrier signal.

The sum signal $S(t)$ shown in expression (3) may be written as:

$$Re[r(t)e^{j\phi(t)}\cdot e^{j\omega_0 t}] \qquad (10)$$

Comparing the expression (10) with the expression (8) gives that $$r(t) = \sqrt{a^2(t) + \hat{a}^2(t)} \qquad (11)$$

and $$\phi(t) = \arctan(\hat{a}(t)/a(t)) \qquad (12)$$

From the expressions (11) and (12) it follows that applying the base band signal $a(t)$ to input terminal 3 as the first modulation signal $x_1(t)$ and applying the Hilbert transform $\hat{a}(t)$ of the baseband signal $a(t)$ to input terminal 4 as the second modulation signal $x_2(t)$ of the embodiment shown in FIG. 2, the said coordinate transforming arrangement being provided on the one hand between the input terminals 3 and 4 and on the other hand between the generator 9 and the arrangement 12, the single-side-band-modulated signal is obtained by summing in the output stage 2 the phase-modulated signals present on the terminals 5 and 6.

Figure 3:
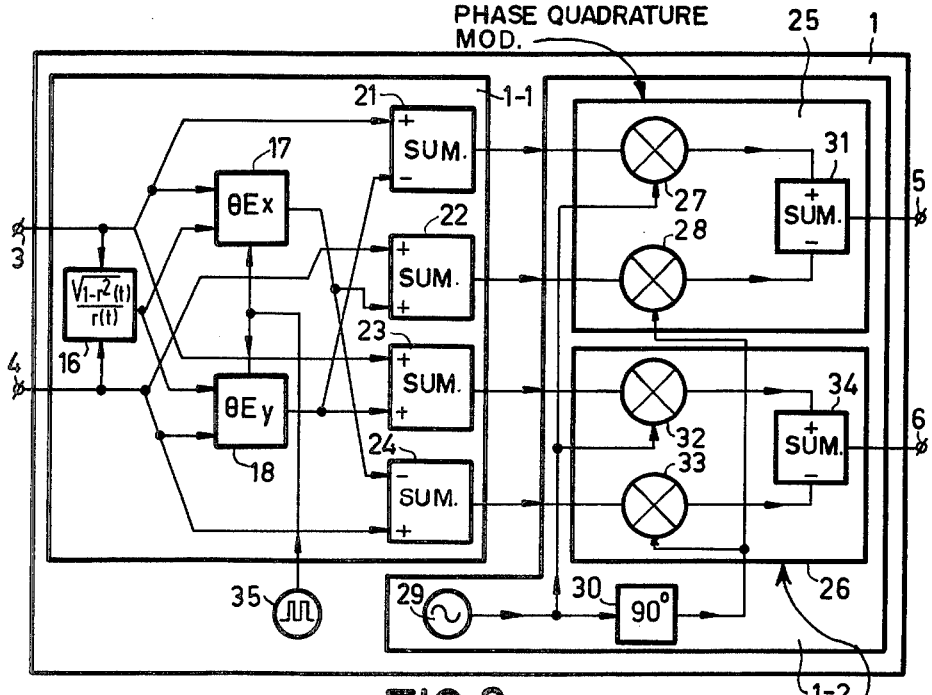
FIG. 3 shows a further embodiment of the phase modulation stage of the block diagram shown in FIG. 1 with dynamic modulator adaptation.
Figure 4:
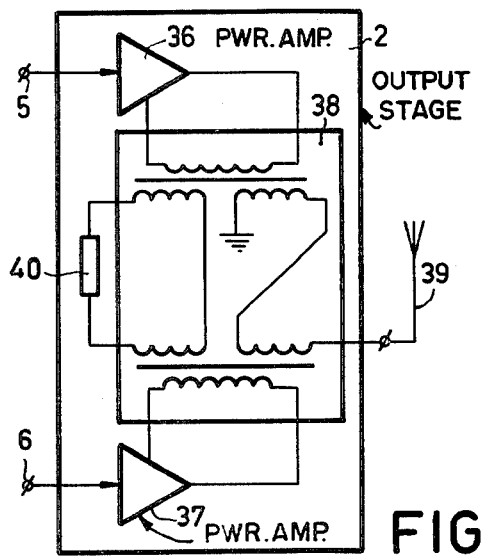
FIG. 4 shows an embodiment of the output stage of the block diagram shown in FIG. 1 suitable for analogue signals.

It should be noted that the Hilbert transform $\hat{a}(t)$ of the baseband signal $a(t)$ can be obtained in a prestage by shifting the phase of every frequency component of the baseband signal $a(t)$ over 90°, as is known per se from the left-hand parts of the FIGS. 4–3(a) and (b) of the book "Single sideband principles and circuits" by Pappenfus et al, 1964.

The phase modulators 13 and 14 generate phase-modulated signals having a spectrum which is wider than the spectrum of the single-sideband signal obtained by summation. The spectra of the biphase-modulated signals, which spectra are located outside the band, must eliminate each other to an acurate extent, which imposes severe requirements on the modulation stage 1 shown in FIG. 2.

FIG. 3 shows a modulation stage embodiment which is very suitable for assembling a single-sideband signal. Said embodiment is based on a signal shown in Cartesian coordinates with $x_1(t)=x(t)$ and $x_2(t)=y(t)$. The signal transforming arrangement 1-1 of this modulation stage 1 comprises, connected between the input terminals 3 and 4, a function generator 16 which assembles from the modulation signals $x(t)$ and $y(t)$ the signal $E(t)=(1/r(t))\sqrt{1-(r(t))^2}$ wherein $r(t)=\sqrt{x^2(t)+y^2(t)}$. Said signal is applied to two multiplying arrangements 17 and 18. The first modulation signal $x_1(t)=x(t)$ is applied to the multiplying arrangement 17 for forming therein the product signal $\theta x(t)E(t)$ and the second modulation signal $x_2(t)=y(t)$ is applied to the second multiplying arrangement 18 for forming therein the product signal $\theta y(t)E(t)$.

The modulation signal x(t) is applied together with the product signal θy(t)E(t) to a fourth summing arrangement 21 which forms the difference signal $$\tfrac{1}{2}(x(t)-\theta y(t)E(t))=\cos\psi(t) \tag{13}$$

In addition, the modulation signal y(t) is applied together with the product signal θx(t)E(t) to a fifth summing arrangement 22, which forms the sum signal $$\tfrac{1}{2}(y(t)+\theta x(t)E(t))=\sin\psi(t) \tag{14}$$

Likewise the modulation signal x(t) is applied together with the product signal θy(t)E(t) to a sixth summing arrangement 23 which forms the sum signal $$\tfrac{1}{2}(x(t)+\theta y(t)E(t))=\cos\chi(t) \tag{15}$$

and the modulation signal y(t) is applied together with the product signal θx(t)E(t) to a seventh summing arrangement 24, which forms the difference signal:

$$\tfrac{1}{2}(y(t)-\theta x(t)E(t))=\sin\chi(t) \tag{16}$$

The signals cos ψ(t), sin ψ(t) and cos χ(t) and sin χ(t) formed by the summing arrangements 21 to 24, inclusive, are applied as output signals of the signal transforming arrangement 1-1 to separate phase quadrature modulators 25 and 26 of the phase modulation arrangement 1-2. The quadrature modulator 25 comprises two multipliers 27 and 28 to which the respective signals cos ψ(t), sin ψ(t) and the carrier signal cos ω₀t, generated by a carrier generator 29, and the carrier signal sin ω₀t obtained via a 90° phase-shifting network 30 are applied to form the product signals: cos ψ(t)·cos ω₀t and sin ψ(t)·sin ω₀t. These signals are subtracted in an eighth summing arrangement 31, which results in the phase-modulated signal $Z_1(t)=\tfrac{1}{2}\cos(\omega_0 t+\psi(t))$ at output terminal 5.

Likewise, the quadrature modulator 26 comprises two multipliers 32 and 33 to which the respective signals cos χ(t), sin χ(t) and cos ω₀t and sin ω₀t are applied to form the product signals cos χ(t)·cos ω₀t and sin χ(t)·sin ω₀t. These product signals are applied to a ninth summing arrangement 34 in which the phase-modulated signal $Z_2(t)=\tfrac{1}{2}\cos(\omega_0 t+\chi(t))$ is formed and supplied at output terminal 6.

In order to achieve that the spectra of the two phase-modulated signals $Z_1(t)$ and $Z_2(t)$, which spectra are located outside the band, accurately eliminate each other, use is made of the fact that in the expressions (4) and (5) θ may be chosen plus one or minus one and that none of the branches of the modulation stage 1 has a memory function. To achieve this, a pulse signal generator 35 having a pulse repetition rate which is at least twice as high as the highest frequency of the modulation signals is connected to the signal transform arrangement 1-1 of the modulation stage 1. Said generator 35 is connected in particular to a third signal input of all multiplying arrangements 17 and 18. Under the control of the pulse signal produced by the generator 35 the value of the quantity is alternatively +1 and −1 in the rhythm of the pulse repetition rate.

This means that the output signals of the multiplying arrangements 17 and 18 change their sign in the rhythm of the pulse repetition rate. This can be achieved by means of, for example, inverting amplifiers which under the control of the pulse signal are alternately switched into and out of signal output circuits, not shown, of the multipliers 17 and 18.

As follows from the expressions (13), (14), (15) and (16), the output signals of the adding arrangements 21 to 24, inclusive, interchange their positions in response to the alternation of the value of the signal θ between the values +1 and −1.

Thus it follows from the formulae (13) and (15) that the output signal of summing arrangement 21 for θ = +1 is the same as the output signal of summing arrangement 23 for θ = −1 and vice versa.

Likewise it follows from the formulae (14) and (16) that the output signal of summing arrangement 22 for θ = +1 is the same as the output signal of summing arrangement 24 for θ = −1 and vice versa.

This results in that the quadrature modulators 25 and 26 each produce the two phase-modulated signals $Z_1(t)$ and $Z_2(t)$, namely alternately in the rhythm of the pulse rate of generator 35, with the proviso that if the modulator 24 produces the signal $Z_1(t)$, the modulator 25 produces the signal $Z_2(t)$ and vice versa. Owing to the dynamic modulator adaptation obtained in this way the unwanted spectra produced by the modulators 24 and 25 cancel each other for the most part by means of subtraction in the output stage connected to the modulation stage 1.

FIG. 4 shows an output stage 2 with power amplification which is advantageous for the electronic arrangement for analog signals.

The output stage 2 comprises two power amplifiers 36 and 37 and a hybrid circuit 38 connected thereto to which on the one hand the output load in the form of an aerial 39 and on the other hand a matching impedance 40 equal to the aerial impedance are connected.

Power amplification of the phase-modulated signals $Z_1(t)$ and $Z_2(t)$ is performed in the amplifiers 36 and 37. Owing to the fact that said signals have a constant amplitude, the non-linear amplification obtained during the amplification (higher harmonics of the carrier frequency) falls outside the band.

In the hybrid circuit the amplified signals $Z_1(t)$ and $Z_2(t)$ are assembled to form the amplitude and phase-modulated signal $S(t)=r(t)\cdot\cos(\omega_0 t+\phi(t))$, wherein r(t) is the first modulation signal $x_1(t)$ and $\phi(t)$ the second modulation signal $x_2(t)$. The signal S(t) is applied in its totality to the aerial 39. When matched properly the hybrid ensures that the non-linear amplifiers do not see each other. This prevents cross-modulation of the two phase-modulated signals.

Figure 14:
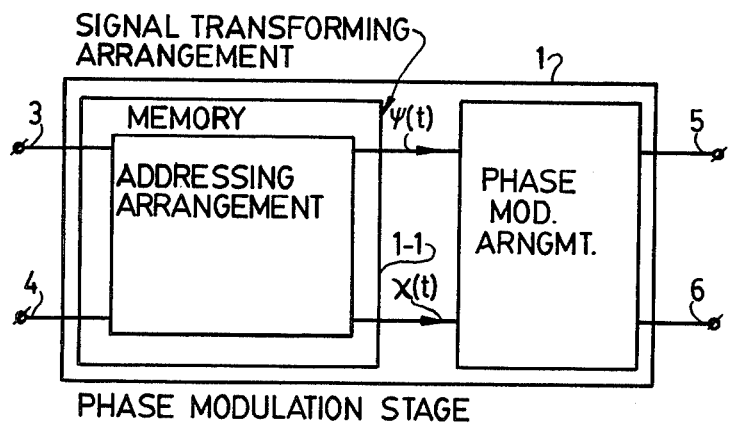
FIG. 14 shows a further embodiment of the phase modulation stage.

In accordance with FIG. 14, it is alternatively possible to use in the signal transform arrangement, instead of the arrangements 16 to 24, inclusive, so-called "look up tables" which comprise memories in which the values of the output signals of the adder arrangements 21 to 24, inclusive, are formed for a large number of discrete values of the input signals $x_1(t)$ and $x_2(t)$. The values of these input signals form the addresses for the output signals which are associated with said input signals, of the adder arrangements 21 to 24, inclusive. The memory arrangement further comprises an addressing arrangement which under the control of the modulation signals reads the signals corresponding therewith and which are proportional to the phase signals ψ(t) and φ(t). This may result in a saving in equipment.

It should be noted that in addition to SSB other forms of amplitude and phase-modulated signals, such as VSB, may alternatively be generated in the above-described manner. The only difference for VSB compared with SSB is that slightly different filters must be used at the base-band level for the generation of the two modulation signals required for VSB.

As mentioned in the foregoing, the generation of an amplitude and phase-modulated signal from two modulation signals by means of two auxiliary signals in the form of phase-modulated signals furnishes the considerable advantage that non-linear distortions in the power amplifiers have no influence on the location of the zero-crossings of the phase-modulated signals. This makes it possible to use any type of amplifier.

If two phase-modulated signals $Z_1(t)$ and $Z_2(t)$ are passed through circuits which are commonly referred to as hard limiter circuits then there are obtained from said signals square-wave signals sign $Z_1(t)$ and sign $Z_2(t)$ which in this example are assembled in the output stage to form a difference signal $$\text{sign } S'(t) = \text{sign } (\cos \omega_o t + \phi(t) + \theta \arccos (r(t))) + \text{sign} \\ (\cos \omega_o t + \phi(t) - \theta \arccos (r(t))) \quad (17)$$

in accordance with the expression $r \cos(\omega_o t + \phi(t)) = \frac{1}{2} \cos(\omega_o t + \psi(t)) + \frac{1}{2} \cos(\omega_o t + \phi(t))$, which has a different construction in order to generate a phase and amplitude-modulated signal from two phase-modulated signals.

Figure 5:
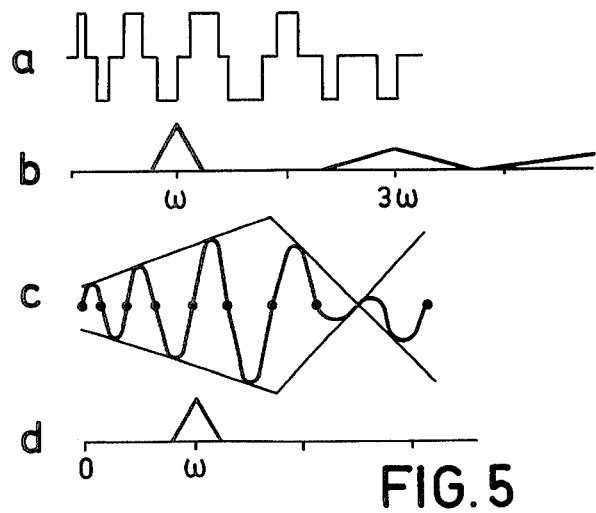
FIG. 5 shows: at $a$ a diagram in which the amplitude and phase-modulated output signal of the block diagram shown in FIG. 1 is represented as a three-level signal; at $b$ a diagram showing the frequency spectrum of the signal shown at $a$; at $c$ a diagram of the signal obtained after filtration by means of a low-pass filter of the signal shown at $a$; at $d$ a diagram of the frequency spectrum of the signal shown at $c$.

Said signal sign $S(t)$ is a three-level signal, owing to the hard limiting of the sub-signals, as is shown in FIG. 5a.

The original amplitude and phase-modulated signal can be recovered therefrom by means of a low-pass filter, which will be demonstrated in the following calculation. It now holds that:

$$\text{sign } (\cos \omega_o t + \phi(t) - \theta \arccos r(t)) = \quad (18)$$
$$\frac{4}{\pi} \sum_{k=1,3,5...}^{k=\infty} (-1)^{(k-1)/2} \frac{\cos k(\omega_o t + \phi(t) - \theta \arccos r(t))}{k}$$

and $$\text{sign } (\cos \omega_o t + \phi(t) - \theta \arccos r(t)) = \quad (19)$$
$$\frac{4}{\pi} \sum_{k=1,3,5,...}^{k=\infty} (-1)^{(k-1)/2} \frac{\cos k(\omega_o t + \phi(t) - \theta \arccos r(t))}{k}$$

In the output stage the signal represented by expression (19) is, for example, added to the signal represented by expression (18) which results in that $$S(t) = \frac{8}{\pi} \sum_{k=1,3,5,...}^{k=\infty} (-1)^{(k-1)/2} \frac{\cos(k \arccos r(t))}{k} \quad (20)$$
$$\cos k (\omega_o t + \phi(t))$$

Writing this sum in individual terms gives $$S(t) = \frac{8}{\pi} r(t) \cos(\omega_o t + \phi(t)) - \frac{8}{\pi} \frac{4r^3(t) - 3r(t)}{3} \quad (21)$$
$$\cos 3(\omega_o t + \phi(t)) + \ldots$$

FIG. 5b shows the frequency spectrum of this signal.

The use of a low-pass filter then results in that $S(t) = r(t) \cos(\omega_o t + \phi(t))$, which signal and associated frequency spectrum are shown in the FIGS. 5c and 5d.

It is assumed that $\omega_o$ is sufficiently high to prevent the occurrence of what is commonly referred to as fold-over.

So it is possible to use class "d" amplifiers in combination with a low-pass filter in the aerial lead to provide a very high efficiency.

Figure 6:
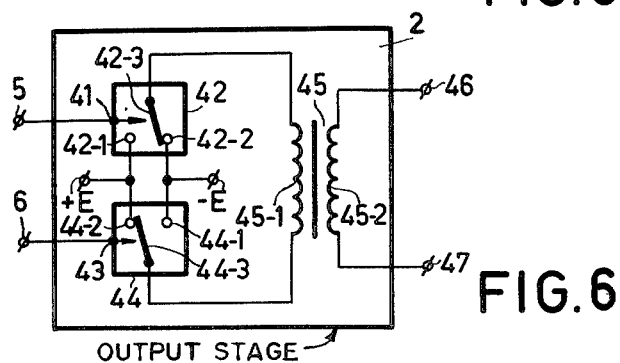
FIG. 6 shows an embodiment of the output stage of the block diagram shown in FIG. 1 by means of a voltage source suitable for generating the signal shown in FIG. 5$a$.

A very advantageous output stage with power amplification is shown in FIG. 6. The square-wave signal sign $Z_1(t)$ obtained by means of hard limiting of the signal $Z_1(t)$ is applied to a control terminal 41 and the square-wave signal sign $Z_2(t)$ obtained by means of hard limiting of the signal $Z_2(t)$ is applied to a control terminal 43 of change-over switches 42 and 44, respectively. Of each change-over switch 42 and 44, respectively, one of the change-over contacts 42-1 and 44-2, respectively is connected to a first terminal +E of a voltage source having a value of 2 E volts and the other change-over contact 42-2 and 44-1, respectively, is connected to a second terminal −E of the voltage source. The switching arms 42-3 and 44-3 of the change-over switches 42 and 44 are interconnected via a primary winding 45-1 of an output transformer 45. An aerial may be connected to terminals 46 and 47 of a secondary winding 45-2 of the transformer 45.

Said output stage 2 operates as follows:

If a value "1" is applied to the control terminals 41 and 43 then the two change-over switches 42 and 44 are in the positions not shown and a current flows from +E to −E via contact 42-1, switching arm 42-3, the primary winding 45-1, switching arm 44-3 and contact 44-1. This current induces a voltage in the secondary winding 45-2 which can be taken off between the terminals 46 and 47.

If the value "0" is applied to the two control terminals 41 and 43 then the change-over switches are in the positions shown, causing a current to flow from +E to −E via contact 44-2, switching arm 44-3, the primary winding 45-1, switching arm 42-3 and contact 42-2. Consequently, the sign of the voltage between the terminals 46 and 47 is reversed. If the value "1" is applied to one of the control terminals 42 or 43 and the value "0" to the other terminal or vice versa then the two switching arms 42-3 and 44-3 are connected to either the terminal +E or the terminal −E and there is no voltage across the primary winding. The voltage between the terminals 46 and 47 is then zero Volts.

Figure 7:
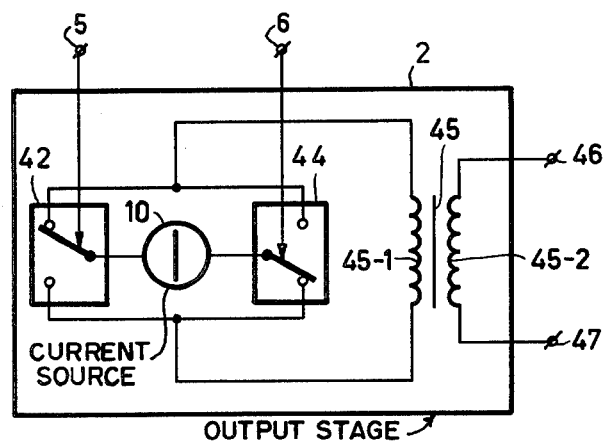
FIG. 7 shows an embodiment of the output stage of the block diagram shown in FIG. 1 which is a dual arrangement of the embodiment shown in FIG. 6.

FIG. 7 shows a dual output stage in which a current source 10 is used instead of a voltage source. At this output stage one end of the primary winding 45-1 of transformer 45 is connected to a contact of the change-over switch 42 as well as to a contact of the change-over switch 44, the other end of the primary winding is connected to the other contact of the change-over switches 42 and 44 and the current source 10 is connected between the switching arms of the change-over switches 42 and 44. This output stage operates in a similar manner as the embodiment shown in FIG. 6, with the proviso that the current flowing through the primary winding of the transformer 45 is produced by the current source 10 instead of by the voltage source. An advantageous embodiment of the change-over switches 42 and 44 of the output stages shown in the FIGS. 6 and 7 is realized with the aid of, for example, MES or MOSFETS.

Figure 8:
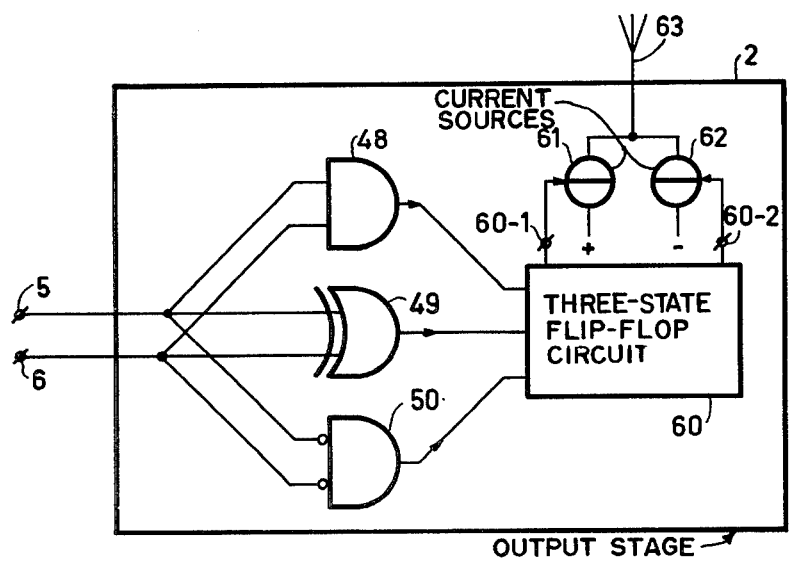
FIG. 8 shows a further embodiment of the output stage of the block diagram shown in FIG. 1 by means of current sources suitable for generating the signal shown in FIG. 5$a$.
Figure 9:
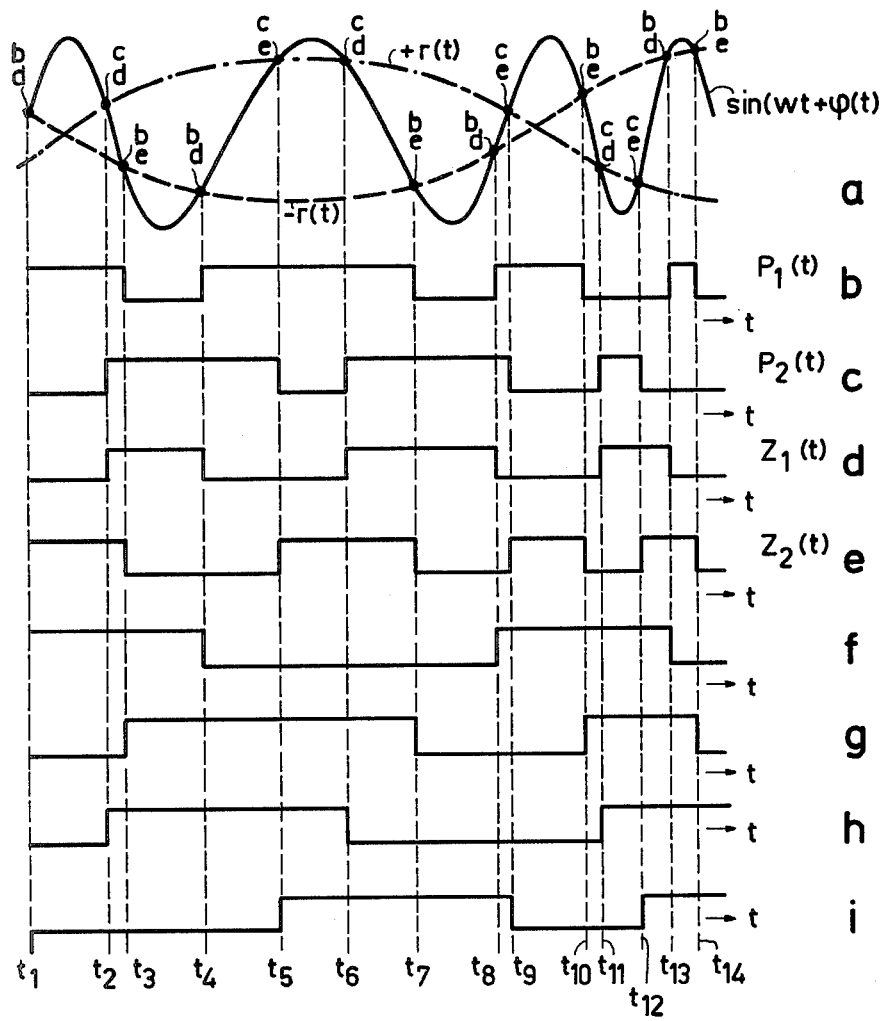
FIG. 9 shows a number of diagrams of signals which may occur in the embodiments shown in the FIGS. 10 and 11.

FIG. 8 shows an other output stage realized by means of current sources. The hard limited phase-modulated signal sign $Z_1(t)$ and sign $Z_2(t)$ applied by the modulation stage 1 to the output stage are applied to three logic gate circuits, namely a first AND-gate circuit 48, an exclusive-NOR-gate circuit 49 and a second AND-gate circuit 50 having two inverting inputs, which generate the respective signals $\text{sign } Z_1(t)\cdot\text{sign } Z_2(t)$; the signal $\overline{\text{sign } Z_1(t)\cdot\text{sign } Z_2(t)} + \overline{\text{sign } Z_1(t)}\cdot\text{sign } Z_2(t)$ and the signal $\overline{\text{sign } Z_1(t)}\cdot\overline{\text{sign } Z_2(t)}$.

These signals are applied to a three-stage flip-flop circuit 60 as set signals on the positive edges, which circuit comprises current sources 61 and 62 connected to outputs 60-1 and 60-2. These current sources 61 and 62 are connected to an aerial 63. Under the control of the output signal produced by the logic circuit 48 the current sources 61 and 62 are switched on on a positive edge of said output signal by the three-state flip-flop circuit 60, which current sources then apply a current having a value 2 I to the aerial 63.

Under the control of the output signal produced by the logic circuit 49 only current source 61 and 62 is switched on on a positive edge of said output signal by the three-state flip-flop circuit 60 in response to which only a current having a value I is applied to the aerial 63. Finally under the control of the output signal produced by the logic circuit 50 the two current sources 61 and 62 are switched off on a positive edge of said signal by the three-state flip-flop circuit 60, so that no current is applied to the aerial.

The aerial cable itself may have a low-pass characteristic so that in that event a discrete low-pass filter is not required, as is shown in the FIGS. 6, 7 and 8.

Figure 10:
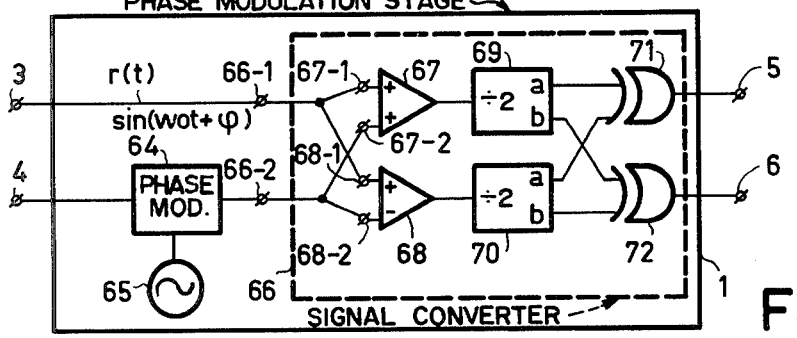
FIG. 10 shows a further embodiment of the phase-modulation stage of the block diagram shown in FIG. 1 suitable for signals having a hard defined level.
Figure 11:
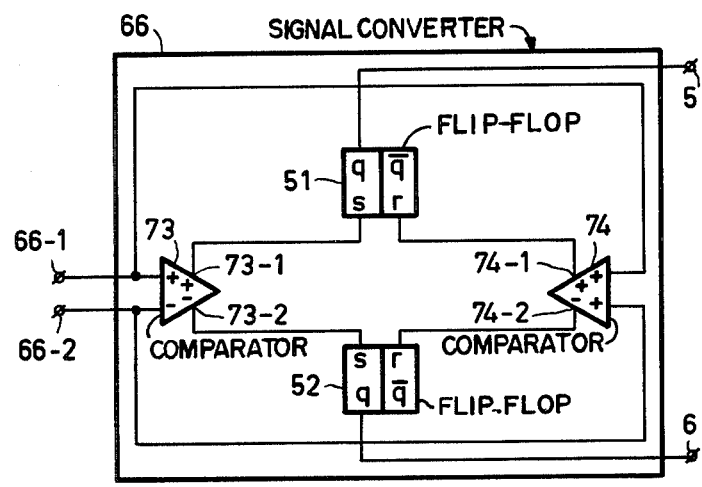
FIG. 11 shows a further embodiment of the signal conversion arrangement of the embodiment shown in FIG. 10.

For those output stages 2, which are controlled by phase-modulated signals having discrete values FIGS. 10 and 11 show very advantageous modulation stages 1. For a more detailed description of these modulation stages it will first be demonstrated with reference to FIG. 9 that there is a relationship between the product of the hard limited phase-modulated signals $\text{sign } Z_1(t)$ and $\text{sign } Z_2(t)$ and the product of two pulse-duration modulated signals $P_1(t)$ and $P_2(t)$ with natural sampling.

The first hard limited phase-modulated signal is $\text{sign } Z_1(t) = \text{sign } (\cos \omega_0 t + \phi(t) + \theta \arccos r(t))$ If, for example $\theta$ is chosen equal to $+1$ then it may be written that:

$$\text{sign } Z_1(t) = \text{sign}\left(\cos \omega_0 t + \phi(t) + \arcsin r(t) + \frac{\pi}{2}\right)$$

$$= -\text{sign } (\sin \omega_0 t + \phi(t) + \arcsin r(t))$$

which signal is shown in FIG. 9d.

The second hard limited phase-modulated signal is $\text{sign } Z_2(t) = \text{sign } (\cos \omega_0 t + \phi(t) - \theta \arccos r(t))$ $\theta = +1$ $$= \text{sign}\left(\cos \omega_0 t + \phi(t) - \arcsin r(t) - \frac{\pi}{2}\right)$$

$$= \text{sign } (\sin \omega_0 t + \phi(t) - \arcsin r(t))$$

which signal is shown in FIG. 9e.

The product of the hard limited phase-modulated signals is consequently equal to:

$-\text{sign } (\sin (\omega_0 t + \phi(t) + \arcsin r(t)))\cdot\text{sign } (\sin (\omega_0 t + \phi(t) - \arcsin r(t)))$ This may be written as:

$-\text{sign } (\sin (\omega_0 t + \phi(t) + \arcsin r(t))\cdot\sin (\omega_0 t + \phi(t) - \arcsin r(t)))$ which corresponds to:

$-\text{sign } (\cos (2 \arcsin r(t)) - \cos 2(\omega_0 t + \phi(t))) = -\text{sign}(1 - 2 \sin^2 (\arcsin^2 r(t)) - 1 + 2 \sin^2 (\omega_0 t + \phi(t))) = -\text{sign } (\sin^2 (\omega_0 t + \phi(t)) - r^2(t))$  (22)

Expression (22) may be written as:

$\text{sign}(r(t) + \sin (\omega_0 t + \phi(t)))\cdot\text{sign}(r(t) - \sin (\omega_0 t + \phi(t)))$ with which it is proved that $\text{sign}(Z_1(t))\cdot\text{sign}(Z_2(t)) = P_1(t)\cdot P_2(t)$  (23)

wherein $P_1(t) = \text{sign}(r(t) + \sin (\omega_0 t + \omega(t)))$ and $P_2(t) = \text{sign}(r(t) - \sin (\omega_0 t + \phi(t)))$.

From (23) it follows that the zero-crossings of the product of the hard limited phase-modulated signals $\text{sign } Z_1(t)$ and $\text{sign } Z_2(t)$ are identical to the zero-crossings of the product of the pulse-width modulated $P_1(t)\cdot P_2(t)$.

In FIG. 9a the function $\sin (\omega_0 t + \phi(t))$ (solid line) the function $+r(t)$ (dot-dash line) and the function $-r(t)$ (dashed line) are shown.

The sign of the function $r(t) + \sin (\omega_0 t + \phi(t))$ which represents the pulse-modulated signal $P_1(t)$ is shown in FIG. 9b. The values for which $\sin (\omega_0 t + \phi(t))$ is equal to $-r(t)$ form the transitions of the pulse-modulated signal $P_1(t)$ which points of intersection are designated by "b" in FIG. 9a. Likewise the points where the signal $+\sin (\omega_0 t + \phi(t))$ intersects the signal $+r(t)$ form the transitions of the pulse-modulated signal $P_2(t)$, which signal $P_2(t)$ is shown in FIG. 9c, use being made of the fact that $r(t) - \sin (\omega_0 t + \phi(t)) = -(\sin (\omega_0 t + \phi(t)) - r(t))$. These points of intersection are designated "c" in FIG. 9a.

As has been demonstrated in the foregoing, the edges of these signals coincide with the edges of the pulse-modulated signals $P_1(t)$ and $P_2(t)$, it appears however that the ascending edges of the signal $\text{sign } Z_1(t)$ coincide with the ascending edges of the signal $P_2(t)$ and the descending edges of the signal $Z_1(t)$ coincide with the ascending edges of the signal $P_1(t)$, which in FIG. 9a is shown by providing the relevant points of intersection with a second designation "d". It likewise appears that the ascending edges of the signal $\text{sign } Z_2(t)$ coincide with the descending edges of the signal $P_2(t)$ and the descending edges of the signal $\text{sign } Z_1(t)$ coincide with the descending edges of the signal $P_1(t)$, which is shown in FIG. 9a by providing the relevant points of intersection with a second designation "e".

The embodiments shown in FIGS. 10 and 11 of a modulation stage 1 utilize the above-mentioned property. Thus, FIG. 10 shows a modulation stage 1, in which a modulation signal $\phi(t)$ applied to an input terminal 4 first modulates in a phase modulator 64 the phase of a carrier signal produced by a carrier generator 65. The signal $\sin (\omega_0 t + \phi(t))$ thus obtained is applied, together with a modulation signal $r(t)$ applied to the input terminal 3, to terminals 66-2 and 66-1 of a signal converter arrangement 66. In arrangement 66 these signals are applied to signal inputs 67-1 and 67-2 of a first comparator circuit 67 and also to signal inputs 68-1 and 68-2 of a second comparator circuit 68. These comparator circuits 67 and 68 differ only in that the signal input 68-2 of circuit 68 is a signal-inverting input while the corresponding input 61-2 of circuit 67 is a signal non-inverting input. The output signals of the comparator circuits 67 and 68 are binary so that comparator circuit 67 produces the pulse-modulated signal $P_1(t)$, shown in FIG. 9b and comparator circuit 68 produces the pulse modulated signal $P_2(t)$, shown in FIG. 9c. The signal $P_1(t)$ is applied to a divide-by-two circuit 69 and the signal $P_2(t)$ to a divide-by-two circuit 70. The output signal at the signal output a of the divide-by-two circuit 69 changes its value at every ascending edge of signal $P_1(t)$ as is shown in FIG. 9f and the output signal from the output b of said divide-by-two circuit 69 changes its value at every descending edge of signal $P_1(t)$ as shown in FIG. 9g.

Likewise the signal on signal output a of the divide-by-two circuit 70 changes at every ascending edge of signal $P_2(t)$ as shown in FIG. 9h and the signal on signal output b of the divide-by-two circuit 70 changes at every descending edge of signal $P_2(t)$ as shown in FIG. 9i. The signal supplied from output a of the divide-by-two circuit 69 and the signal supplied from output a of the divide-by-two circuit 70 are applied to an exclusive-OR-circuit 71 which forms from these signals the signal sign $Z_1(t)$ shown in FIG. 9d, which can be taken off from output 5.

Likewise the signal from output b of the divide-by-two circuit 70 and the signal from output b of the divide-by-two circuit 69 are applied to an exclusive "OR"-circuit 72, which forms from these signals the signal sign $Z_2(t)$ shown in FIG. 9e, which can be taken from output 6.

Owing to the fact that the initial state of the divide-by-two circuits is not defined, said signal converter arrangement 66 comprising divide-by-two circuits 69 and 70 creates an uncertainty as regards the sign of the output signal sign $S(t)$ obtained by summation in the output stage 2.

To avoid this, FIG. 11 shows a different embodiment of a signal converter 66 for use in a modulation stage 1 as shown in FIG. 10. This arrangement 66 also employs pulse-duration modulated signals for generating the hard limited phase-modulated signals, but differs in that it comprises a logic circuit which only responds to positive signal changes.

The signals $r(t)$ and $\sin(\omega_0 t + \phi(t))$ applied to the input terminals 66-1 and 66-2 are applied to two further comparator arrangements 73 and 74, respectively, which only differ from the comparator arrangements 68 and 67, respectively, shown in FIG. 10, in that in addition to signal outputs 73-1 and 74-1 they also have signal inverting outputs 73-2 and 74-2.

Consequently, the output signal of output 73-1 is equal to the signal $P_2(t)$ shown in FIG. 9c and the output signal at output 73-2 is the inverse of said signal.

Likewise the output signal at output 74-1 is the signal $P_1(t)$ shown in FIG. 9b and the output signal at output 74-2 is the inverse of said signal.

A set-reset flip-flop circuit 51 which is only responsive to positive edges is provided between the outputs 73-1 and 74-1.

The operation will be described in greater detail with reference to FIGS. 9b to 9e, inclusive.

At the instant $t_2$ there occurs in the output signal 9c at output 73-1 a positive edge which sets the flip-flop circuit 51 to the initial state and the signal output q delivers a high signal (FIG. 9d) from output 5. At the instant $t_4$ there occurs in the output signal 9b at output 74-1 a positive edge which resets the flip-flop circuit 51 and the signal output q supplies a low signal (FIG. 9d), etc. Consequently, the hard-limited first phase-modulated signal sign $Z_1(t)$ as shown in FIG. 9d appears at output terminal 5.

A flip-flop circuit 52 is provided between the outputs 73-2 and 74-2.

In a similar manner as was demonstrated for flip-flop circuit 51 it can be demonstrated from the inverse version of the signals shown in the FIGS. 9b and 9c, which are supplied by the outputs 73-2 and 74-2 that the signal output q of said flip-flop circuit 52 applies the hard-limited second phase-modulated signal sign $Z_2(t)$ to output terminal 6.

It is further obvious that if the flip-flop circuit 52 is only responsive to negative edges the input of said flip-flop circuit must then also be connected between the output terminal 73-1 and 74-1 in order to obtain the signal $Z_2(t)$ at output terminal 6, etc.

Figure 12:
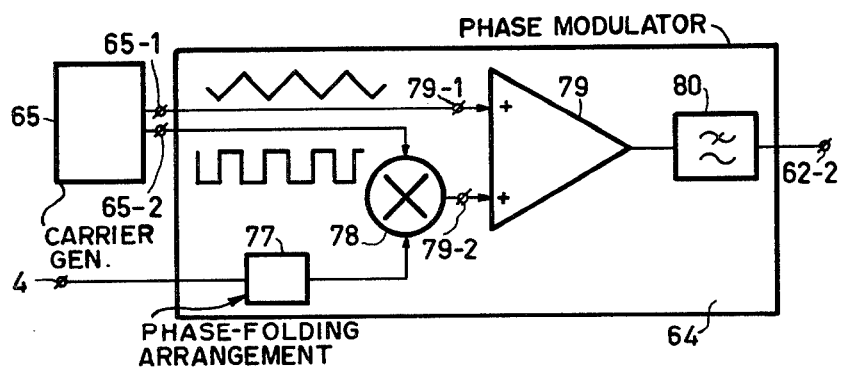
FIG. 12 shows a further embodiment of the phase modulator and carrier generator of the embodiment shown in FIG. 10.

FIG. 12 shows an embodiment which is suitable for the phase modulator 64 of FIG. 10.

The modulation signal $\phi(t)$ applied to the input terminal 4 is applied to a phase-folding arrangement 77, which converts the signal $\phi(t)$ into a signal $\sin \Phi(t)$ in a manner still to be described. Said signal $\sin \Phi(t)$ is applied to a multiplier 78 where the signal is multiplied by a signal sign $(\cos \omega_0 t)$, wherein $\omega_0$ represents the angular frequency of the carrier signal. Said signal sign $\cos(\omega_0 t)$ is supplied by an output 65-2 of the carrier generator 65. For that purpose a hard-limiting circuit, not shown, is provided in the output circuit of the carrier generator.

In the multiplier 78 the sign of the signal $\sin \Phi(t)$ is switched between plus and minus by the signal sign $\cos(\omega_0 t)$ at the rate of the carrier frequency. The output signal sign $(\cos \omega_0 t) \cdot \sin \Phi(t)$ of the multiplier 78 is applied to an input 79-2 of a further comparator circuit 79 where a carrier signal $\sin \omega_0 t$ supplied by the output 65-1 of the carrier generator 65 is applied to an input 79-1. Said additional comparator circuit 79 generates from these input signals the signal sign $(\sin \omega_0 t + \text{sign} (\cos \omega_0 t) \cdot \sin \Phi(t))$ which signal is identical to the signal sign $\sin(\omega_0 t + \phi(t))$ as will be demonstrated hereinafter.

For the zero-crossings of the signal produced by the comparator circuit 79 it holds that $$\sin \omega_0(t) = \text{sign} (\cos \omega_0 t) \sin \Phi(t)$$

For consecutive zero-crossings it therefore applies that $$\sin \omega_0 t = -\sin \Phi(t)$$

$$\sin \omega_0 t = +\sin \Phi(t)$$

$$\sin \omega_0 t = -\sin \Phi(t) \text{ etc.}$$

This means that:

$$\omega_0 t + \Phi(t) = K\pi$$

wherein $K = (\ldots, 0,1,2,3, \ldots)$. This relation represents the zero-crossings of the signal sign $(\sin \omega_0 t + \Phi(t))$, so that the output signal of the further comparator circuit 79 is equal to sign $\sin(\omega_0 t + \Phi(t))$. Now the signal $\sin(\omega_0 t / \Phi(t))$ is identical to the signal $\sin(\omega_0 t + \phi(t))$ if $\Phi(t)$ is chosen so that it holds that $-\pi/2 \leq \Phi(t) \leq +\pi/2$, so is limited, while $\phi(t)$ is unlimited. The phase-folding arrangement 77 must consequently ensure that the signal $\phi(t)$ in the signal $\Phi(t)$ is converted, $\Phi(t)$ within the above-mentioned value being limited in order to apply a signal having a finite value to the multiplier 78, for example at a continuously increasing value of the signal $\phi(t)$. For that purpose the phase-folding arrangement has, for example, a characteristic as shown in FIG. 13.

Figure 13:
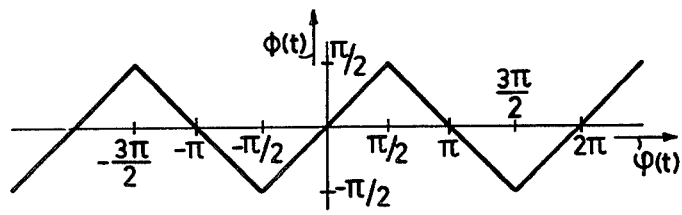
FIG. 13 is a diagram of the characteristic of the phase-folding arrangement of the embodiment shown in FIG. 10.

FIG. 13 shows that associated with each value of the input signal $\phi(t)$ there is a predetermined value of the output signal $\Phi(t)$ located within the limits $-\pi/2$ and $+\pi/2$. Associated with the sawtooth-shaped characteristic, shown in FIG. 13, for the conversion of the signal $\phi(t)$ into $\Phi(t)$, which contains the signal sin $\Phi(t)$ as the fundamental wave there is a likewise sawtooth-shaped signal as the carrier signal. This is illustrated in FIG. 12 for the output signal from the output 65-1 of the carrier generator 65. It is, however, possible to use sinusoidal signals or other approximate signals instead of the sinusoidal signals represented by the sawtooth-shaped signals.

From the foregoing it has been found that the relationship between the signals $\phi(t)$ and $\Phi(t)$ is unambiguous. Said folding arrangement may consequently be represented by means of a table which is commonly referred to as a "look-up table", which comprises a memory in which for each value of the input signal $\phi(t)$ the associated value of the output signal $\Phi(t)$ is stored and for which the input signal $\phi(t)$ is employed as the address signal of the associated signal $\Phi(t)$.

Via a low-pass filter 80 the output signal of the further comparator circuit is applied to a terminal 62-2 where the phase-modulated carrier signal sin $(\omega_0 t + \phi(t))$ becomes available for further processing.

The embodiments of the modulation stage 1 as shown in the FIGS. 10 and 11 have the advantage that they may be realize in integrated form and may be connected to, for example, the output stage 2 shown in FIGS. 6, 7 or 8.

The electronic arrangement for generating, for example, a high power single-sideband signal is then in the form of an integrated modulation stage 1 connected to an output stage 2 formed by change-over switches in the form of, for example, MESFET-transistors, and an output transformer.

From the foregoing description it will be obvious that any type of signal, such as for example any two data signals may be chosen as the modulation signals $x_1(t)$ and $x_2(t)$. The electronic arrangement is particularly suitable to modulate one single incoming bit stream of a data signal, coded in accordance with the four-phase method with reduced bandwidth, on a carrier signal, it being possible to use the x and y components of the phase points in the phase plane as the modulation signals $x_1(t)$ and $x_2(t)$, or the x component and the y component shifted over half a period of the phase points. These last-mentioned modulation signals then result in a OQPSK signal.

What is claimed is:

1. An electronic arrangement for generating an amplitude and phase-modulated carrier signal, said arrangement comprising a phase modulation stage having first and second inputs for receiving two respective modulation signals, said modulation stage being under the control of the modulation signals and generating in use two different phase-modulated signals having the same carrier frequency and substantially the same amplitude, and an output stage to which said phase-modulated signals are applied for assembling by means of summation of said phase-modulated signals to produce said amplitude and phase-modulated carrier signal the amplitude of which is modulated in dependence on the phase difference of said phase-modulated signals and the phase of which is modulated in dependence on the sum of the phases of said phase-modulated signals.

2. An electronic arrangement as claimed in claim 1, wherein said two modulation signals consist of a first modulation signal $x_1(t)$ and a second modulation signal $x_2(t)$ and said two phase-modulated signals are of the form $Z_1(t) = a \cos(\omega_0 t + \psi(t))$ and $Z_2(t) = a \cos(\omega_0 t + \chi(t))$, the phase $\psi(t)$ of said first phase-modulated signal $Z_1(t)$ being equal to $\phi(t) + \theta$ arccos $(r(t)/2a) + m \cdot 2\pi$ and the phase $\chi(t)$ of said second phase-modulated signal $Z_2(t)$ being equal to $$\phi(t) - \theta \arccos(r(t)/2a) + n \cdot 2\pi + \frac{1-\eta}{2} \pi$$

wherein $\eta = \pm 1$, it holding that $\eta = +1$ when adding $Z_1(t) + Z_2(t)$ to form the summation signal $S(t)$ and $\eta = -1$ when subtracting $Z_2(t)$ from $Z_1(t)$ to form the difference signal $S'(t)$, and said modulation signals $x_1(t)$ and $x_2(t)$ representing the coordinates of a vector in a system of coordinates, which vector, when transformed into a system of polar coordinates, is represented by the quantities $r(t)$ and $\phi(t)$, wherein $\theta = \pm 1$, m, and n being integers and said amplitude and phase-modulated signal $S(t)$ and $S'(t)$ respectively being represented by $r(t) \cos(\omega_0 t + \phi(t))$.

3. An electronic arrangement as claimed in claim 2, wherein said phase modulation stage comprises a signal transforming arrangement and a phase modulation arrangement, said signal transforming arrangement is arranged for generating from said modulation signals $x_1(t)$ and $x_2(t)$ signals which are proportional to said phases $\psi(t)$ and $\chi(t)$ and said phase modulation stage comprises phase modulators for generating said phase-modulated signals $Z_1(t)$ and $Z_2(t)$ from said signals which are proportional to the phases $\psi(t)$ and $\chi(t)$.

4. An electronic arrangement as claimed in claim 3, wherein said signal transforming arrangement comprises an arccosine generator for generating the signal $\theta$ arccos $(r(t)/2a)$ from said modulation signals, and second and third summing arrangements to which the output signal of said arccosine generator and said signal $\phi(t)$ are applied, for assembling in said second summing arrangement the phase signal $\psi(t) = \phi(t) + \theta$ arccos $(r(t)/2a)$ by means of addition and for assembling the phase signal $\chi(t) = \phi(t) - \theta$ arccos $(r(t)/2a)$ in said third summing arrangement by means of subtraction.

5. An electronic arrangement as claimed in claim 1, wherein said phase modulation stage comprises a signal transforming arrangement and a phase modulation arrangement, said two modulation signals consist of a first modulation signal $x_1(t)$ and a second modulation signal $x_2(t)$, said signal transforming arrangement comprises a function generator connected to said inputs of said phase modulation stage for generating the signal $E(t) = (1/r(t)) \sqrt{1 - r^2(t)}$ from said modulation signals $x_1(t)$ and $x_2(t)$, two multiplying arrangements a first of which is connected to said first input and a second of which is connected to said second input and which are both connected to said function generator, a pulse signal generator connected to said two multiplying arrangements, said generator having a pulse repetition rate which is at least twice as high as the highest signal frequency of said modulation signals, said pulse signal representing a signal $\theta$, for forming in one multiplying arrangement the product signal $\theta \cdot x_1(t) \cdot E(t)$ and for forming in the other multiplying arrangement the product signal $\theta \cdot x_2(t) \cdot E(t)$, a fourth, fifth, sixth and seventh summing arrangement, the fourth summing arrangement being connected to said first input and to said second multiplying arrangement for forming the difference signal $\frac{1}{2}(x_1(t) - \theta x_2(t) \cdot E(t)) = \cos \psi(t)$, the fifth summing arrangement being connected to said second input and said first multiplying arrangement for forming the sum signal $\frac{1}{2}(x_2(t) + \theta x_1(t) \cdot E(t)) = \sin \psi(t)$, the sixth summing arrangement being connected to said first input and to said second multiplying arrangement for forming the sum signal $\frac{1}{2}(x_1(t) + \theta x_2(t) \cdot E(t)) = \cos \chi(t)$, and the seventh summing arrangement being connected to said second input and to said first multiplying arrangement for forming the difference signal $\frac{1}{2}(x_2(t) - \theta x_1(t) \cdot E(t)) = -\sin \chi(t)$, and wherein the modulation arrangement comprises two quadrature modulators a first of which is connected to said fourth and fifth summing arrangements for forming the signal $\frac{1}{2} \cos (\omega_o t + \psi(t)) = Z_1(t)$ and a second of which is connected to said sixth and seventh summing arrangements for forming the signal $\frac{1}{2} \cos (\omega_o t + \omega(t)) = Z_2(t)$.

6. An electronic arrangement as claimed in claim 3, wherein said signal transforming arrangement comprises a memory arrangement to which samples of said modulation signals $x_1(t)$ and $x_2(t)$ are applied as addressing signals and in each memory address there are stored output signals which are proportional to said phase signals $\psi(t)$ and $\chi(t)$ and associated with each combination of signals $x_1(t)$ and $x_2(t)$ and wherein said memory arrangement comprises an addressing arrangement for reading out under the control of said addressing signals the output signals associated with each address.

7. An electronic arrangement as claimed in claim 2, wherein said phase modulation stage comprises a phase modulator connected to one of said inputs and having a carrier generator connected thereto for modulating the phase of a carrier signal with said modulation signal present on said input, a first comparator circuit having two signal input terminals a first input terminal of which is connected to said phase modulator and the second input terminal of which is connected to the other input for generating from said phase-modulated signal and said other modulation signal a first pulse-duration modulated signal with natural sampling, a second comparator circuit having a signal input terminal and a signal inverting input terminal, said signal inverting input terminal being connected to said phase modulator and said signal input terminal being connected to said other input for generating from said phase-modulated signal and said other modulation signal a second pulse-duration modulated signal with natural sampling, and a logic signal converter arrangement connected to the comparator circuits for generating said two phase-modulated signals $Z_1(t)$ and $Z_2(t)$ in hard-limited form from said pulse-duration modulated signals.

8. An electronic arrangement as claimed in claim 7, wherein said logic signal converting arrangement comprises first and second divide-by-two circuits connected respectively to said first and second comparator circuits, each divide-by-two circuit having two outputs for producing at a first output one of the two possible divided signals obtained by division by two of the pulse-duration modulated signals applied thereto and for producing at the second output the other divided signal obtained by means of division by two, a first exclusive-"OR"-gate circuit connected to said first output of said first divide-by-two circuit and to the first output of said second divide-by-two circuit, a second exclusive "OR"-gate circuit connected to said second output of said second divide-by-two circuit and to said second output of said first divide-by-two circuit, and wherein the outputs of the exclusive "OR"-gate circuits are outputs of said modulation stage.

9. An electronic arrangement as claimed in claim 7, wherein said comparator circuits each have a signal output and an inverting signal output and said logic signal converter arrangement comprises two flip-flop circuits each being only responsive to edges of one polarity, and wherein the inputs of one of said two flip-flop circuits are connected to said signal outputs of said two comparator circuits and the inputs of the other of said two flip-flop circuits are connected to said signal inverting outputs of said two comparator circuits, the outputs of said flip-flop circuits being the outputs of said modulation stage.

10. An electronic arrangement as claimed in any one of claims 1-9 wherein said output stage comprises an amplifying summing arrangement for amplifying and summing said phase-modulated signals $Z_1(t)$ and $Z_2(t)$ applied to said output stage and for assembling said signals to form said amplitude and phase-modulated output signal.

11. An electronic arrangement as claimed in claim 10, wherein said amplifying summing arrangement comprises two amplifiers for individually amplifying said phase-modulted signals $Z_1(t)$ and $Z_2(t)$, a hybrid circuit connected to the outputs of said amplifiers for assembling said phase-modulated signals supplied by the amplifiers to form said amplitude and phase-modulated signal and wherein the output of said hybrid circuit is the output of said output stage.

12. An electronic arrangement as claimed in claim 10, wherein said amplifying summing arrangement comprises a first logic "AND"-gate circuit, a second logic "AND"-gate circuit having two signal-inverting inputs, and a logic exclusive-NOR-gate circuit, one of ths signal inputs of said first "AND"-gate circuit, one of the inputs of said exclusive NOR-gate circuit and one of the inverting signal inputs of the said second "AND"-gate circuit being connected to one input of the output stage, the other signal input of said first "AND"-gate circuit, the other signal input of said exclusive NOR-gate circuit and the other signal-inverting input of said second "AND"-gate circuit being connected to the other input of the output stage, a three-state trigger circuit connected to said logic gate circuits and two current sources having control inputs which are connected to respective signal outputs of said three-stage trigger circuit, the outputs of said current sources being the output of the output stage.

13. An electronic arrangement as claimed in claim 10, wherein said amplifying summing arrangement comprises a transformer and two change-over switches having control inputs, the control inputs of said change-over switches are each connected to one respective input of the two inputs of said output stage, one of the contacts of each of the two change-over switches is connected to a first terminal of a voltage source, the other contact of each of the two change-over switches is connected to a second terminal of the voltage source with a voltage different from the first terminal, the switching arms of the change-over switches are interconnected via a primary winding of said transformer and wherein a secondary winding of said transformer is the output of the output stage.

14. An electronic arrangement as claimed in claim 10, wherein said amplifying summing arrangement comprises a transformer, a first current source and two change-over switches having control inputs, one of the contacts of each of the two change-over switches is connected to one end of the primary winding of said transformer, the other contact of each of the two change-over switches is connected to the other end of the primary winding of said transformer, the current source is connected between the switching arms of said change-over switches and wherein the control inputs of said change-over switches are each connected to a respective input of the two inputs of the output stage.

15. An electronic circuit as claimed in any one of claims 7-9, wherein said phase modulator comprises a phase-folding arrangement connected to an input for limiting the phase of the modulation signal present on said input terminal within the limits $-\pi/2$ and $+\pi/2$, said carrier generator having two outputs for supplying two carrier signals whose phases are shifted 90° relative to each other, a further multiplier is connected to the phase-folding circuit and to one of the outputs of said carrier generator, a comparator circuit is connected to the multiplier and to the other output of said carrier generator and wherein a low-pass filter is connected to the output of the further comparator circuit.

* * * * *